(12) United States Patent
Rodder et al.

(10) Patent No.: US 9,331,176 B2
(45) Date of Patent: May 3, 2016

(54) METHODS OF FORMING FIELD EFFECT TRANSISTORS, INCLUDING FORMING SOURCE AND DRAIN REGIONS IN RECESSES OF SEMICONDUCTOR FINS

(71) Applicant: Samsung Electronics Co., Ltd., Suwon-si (KR)

(72) Inventors: Mark S. Rodder, University Park, TX (US); Dong-Won Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/870,471

(22) Filed: Apr. 25, 2013

(65) Prior Publication Data

US 2014/0322882 A1   Oct. 30, 2014

(51) Int. Cl.
  *H01L 29/78*  (2006.01)
  *H01L 29/66*  (2006.01)

(52) U.S. Cl.
  CPC .... *H01L 29/66795* (2013.01); *H01L 29/66545* (2013.01); *H01L 29/785* (2013.01); *H01L 29/7856* (2013.01)

(58) Field of Classification Search
  CPC ................ H01L 29/66795; H01L 29/66803; H01L 29/785; H01L 29/7856
  See application file for complete search history.

(56) References Cited

U.S. PATENT DOCUMENTS

| | | | |
|---|---|---|---|
| 7,101,766 B2 * | 9/2006 | Jung | 438/304 |
| 7,265,418 B2 | 9/2007 | Yun et al. | |
| 7,323,389 B2 | 1/2008 | Goktepeli et al. | |
| 7,518,196 B2 * | 4/2009 | Chau et al. | 257/401 |
| 8,258,585 B2 * | 9/2012 | Sasaki et al. | 257/401 |
| 8,367,498 B2 | 2/2013 | Chang et al. | |
| 2004/0166611 A1 | 8/2004 | Liu | |
| 2008/0265321 A1 | 10/2008 | Yu et al. | |
| 2011/0147828 A1 * | 6/2011 | Murthy et al. | 257/327 |
| 2011/0147842 A1 | 6/2011 | Cappellani et al. | |
| 2011/0171795 A1 | 7/2011 | Tsai et al. | |
| 2011/0223736 A1 * | 9/2011 | Lin et al. | 438/305 |
| 2011/0269282 A1 | 11/2011 | Kawasaki | |
| 2012/0193713 A1 | 8/2012 | Kulkarni et al. | |

FOREIGN PATENT DOCUMENTS

| | | |
|---|---|---|
| JP | 2009-016411 A | 1/2009 |
| KR | 10-2006-0072411 A | 6/2006 |
| KR | 10-2007-0064009 A | 6/2007 |

OTHER PUBLICATIONS

Smith, C.E. (2008). *Advanced Technology for Source Drain Resistance Reduction in Nanoscale FinFETs.* (Doctoral dissertation). University of North Texas, Texas. 123 pages.

(Continued)

*Primary Examiner* — Bryan Junge
(74) *Attorney, Agent, or Firm* — Myers Bigel & Sibley, P.A.

(57) ABSTRACT

Methods of forming a fin-shaped Field Effect Transistor (FinFET) are provided. The methods may include selectively incorporating source/drain extension-region dopants into source and drain regions of a semiconductor fin, using a mask to block incorporation of the source/drain extension-region dopants into at least portions of the semiconductor fin. The methods may include removing portions of the source and drain regions of the semiconductor fin to define recesses therein. The methods may include epitaxially growing source and drain regions from the recesses in the semiconductor fin.

21 Claims, 17 Drawing Sheets

(56) References Cited

OTHER PUBLICATIONS

Synopsys, Jamil Kawa, DesignWare Technical Bulletin, FinFET Design, Manufacturability, and Reliability, Jan. 2013, 5 Pages, Retrieved from URL http://www.synopsys.com/Company/Publications/DWTB/Pages/dwtb-finfet-jan2013.aspx.

Wikipedia, File:Different FinFET structures which can be modeled by BSIM-CMG.png, Mar. 25, 2012, 2 Pages, Retrieved from URL http://en.wikipedia.org/wiki/File:Different_FinFET_structures_which_can_be_modeled_by_BSIM-CMG.png.

* cited by examiner

US 9,331,176 B2

METHODS OF FORMING FIELD EFFECT TRANSISTORS, INCLUDING FORMING SOURCE AND DRAIN REGIONS IN RECESSES OF SEMICONDUCTOR FINS

FIELD

The present disclosure generally relates to the field of semiconductor devices and, more particularly, to field effect transistors.

BACKGROUND

A semiconductor device having non-uniform capacitance from upper to lower regions of a semiconductor fin may also have non-uniform parasitic resistance from the upper to lower regions. As a result, a ratio of on-current to off-current of the semiconductor device may be relatively low, which may inhibit performance of the semiconductor device.

SUMMARY

Various embodiments of the present disclosure may provide methods of forming a fin-shaped Field Effect Transistor (FinFET). The methods may include forming a gate on a channel fin protruding from a substrate, and implanting dopants into the channel fin after forming the gate. The methods may include recessing the channel fin, to form respective curved recess regions on opposing sides of the gate. The methods may include forming an epitaxial material in the curved recess regions, such that the epitaxial material is adjacent curved channel fin regions of the doped channel fin. The curved recess regions including the epitaxial material may include curved source/drain regions. Moreover, the methods may optionally include forming spacers on the gate before recessing the channel fin. Additionally or alternatively, the substrate may be a Silicon Germanium substrate.

In various embodiments, implanting the dopants into the channel fin may include implanting the dopants into the channel fin to form doped channel fin regions before recessing the channel fin. Implanting the dopants into the channel fin may form upper and lower regions of the channel fin that include first and second dopant concentrations, respectively. The second dopant concentration may be a smaller dopant concentration than the first dopant concentration. Moreover, recessing the channel fin may include recessing the doped channel fin regions to form the curved channel fin regions. Recessing the doped channel fin regions may include removing a larger portion of the upper region of the channel fin than the lower region of the channel fin, such that a larger percentage of the second dopant concentration remains than the first dopant concentration.

According to various embodiments, implanting the dopants into the channel fin may include implanting the dopants into the curved channel fin regions after recessing the channel fin. Moreover, the dopants may be implanted into the curved channel fin regions before or after forming the epitaxial material.

In various embodiments, forming the epitaxial material may include forming the epitaxial material in the curved recess regions such that the epitaxial material undercuts a portion of the gate. Additionally or alternatively, a first capacitance of an upper region of the doped channel fin adjacent the gate may be a larger capacitance than a second capacitance of a lower region of the doped channel fin adjacent a surface of the substrate.

Methods of forming a fin-shaped Field Effect Transistor (FinFET), according to various embodiments, may include selectively incorporating source/drain extension-region dopants into source and drain regions of a semiconductor fin, using a mask to block incorporation of the source/drain extension-region dopants into at least portions of a channel region of the semiconductor fin. The methods may then include removing portions of the source and drain regions of the semiconductor fin to define recesses therein and to remove some of the source/drain extension-region dopants in the source and drain regions. Moreover, the methods may include epitaxially growing source and drain regions from the recesses in the semiconductor fin. The epitaxially growing may be preceded by forming sidewall spacers on the dummy gate electrode. Additionally or alternatively, the mask may be a dummy gate electrode.

In various embodiments, the semiconductor fin may protrude from a Silicon Germanium substrate. Additionally or alternatively, the selectively incorporating may include selectively incorporating the source/drain extension-region dopants into the source and drain regions by implantation, by plasma doping, or by a removable dopant source overlying the semiconductor fin. Moreover, the epitaxially growing may include epitaxially growing the source and drain regions from the recesses in the semiconductor fin to undercut a portion of the mask. A first capacitance of an upper region of the semiconductor fin adjacent the mask may be a larger capacitance than a second capacitance of a lower region of the semiconductor fin farther from the mask.

According to various embodiments, the epitaxially growing may include epitaxially growing in-situ doped source and drain regions from the recesses in the semiconductor fin, where the recesses may be curved recesses. Moreover, the removing may include removing less than all of the portions of the source and drain regions of the semiconductor fin including source/drain extension-region dopants therein.

Methods of forming a fin-shaped Field Effect Transistor (FinFET), according to various embodiments, may include removing portions of source and drain regions of a semiconductor fin to define recesses therein adjacent curved regions of the semiconductor fin. The methods may also include epitaxially growing in-situ doped source and drain regions from the recesses in the semiconductor fin by varying in-situ doping levels.

In various embodiments, the semiconductor fin may include upper and lower regions, and epitaxially growing the in-situ doped source and drain regions may include epitaxially growing the in-situ doped source and drain regions from the recesses in the semiconductor fin by varying in-situ doping levels. Moreover, a first capacitance of the upper region of the semiconductor fin may be a larger capacitance than a second capacitance of the lower region of the semiconductor fin.

Other methods according to embodiments of the present disclosure will be or become apparent to one with skill in the art upon review of the following drawings and detailed description. It is intended that all such additional methods be included within this description, be within the scope of the present inventive concepts, and be protected by the accompanying claims. Moreover, it is intended that all embodiments disclosed herein can be implemented separately or combined in any way and/or combination.

DETAILED DESCRIPTION

Figure 1A:
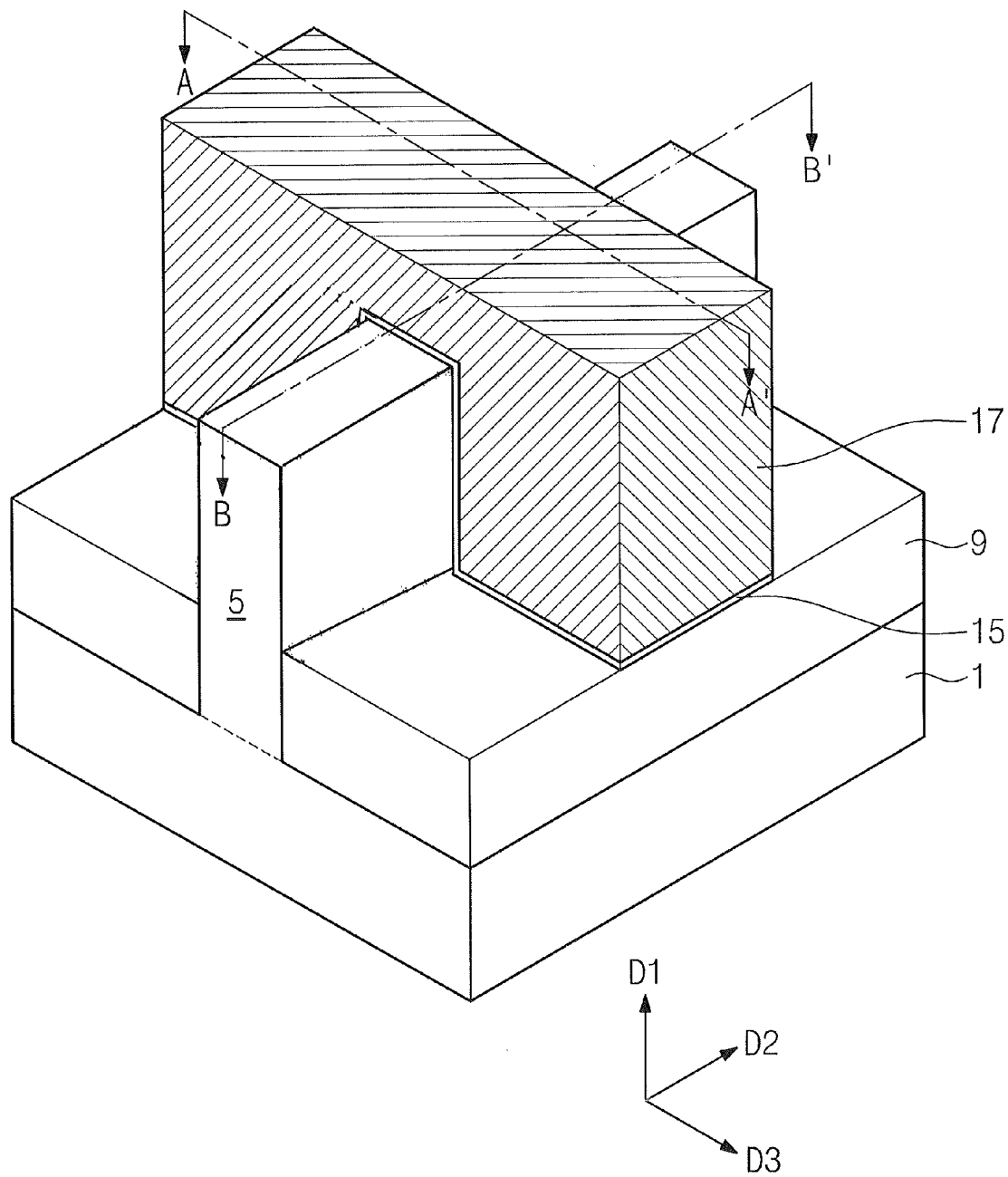
FIG. 1A is a perspective view illustrating a fin-shaped field effect transistor, according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present inventive concepts should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

As appreciated by the present inventive entity, although curved recess regions may be formed more easily in a semiconductor fin than recess regions with vertical sidewalls, the curved recess regions may also provide a substantially larger effective channel length between source and drain regions near the bottom of the fin than near the top of the fin. For example, the curved recess regions may result in a distance between the source and drain regions near the bottom of the fin that is substantially larger than the length of an overlying dummy gate electrode. Accordingly, the large effective channel length near the bottom of the fin may mean that the dummy gate electrode does not overlap source/drain dopants near the bottom of the fin, thus providing a low overlap capacitance near the bottom of the fin. Such a low capacitance may lead to a high parasitic resistance and thus a low contribution to on-current near the bottom of the fin. The top of the fin, on the other hand, may have a desired higher overlap capacitance, which may lead to a low parasitic resistance and thus a high contribution to on-current near the top of the fin. Accordingly, the non-uniform overlap capacitance along the depth of the fin may result in a substantially smaller contribution to on-current by the bottom of the fin, which may lead to a low overall on-current for the fin.

Moreover, various techniques of attempting to increase on-current may have disadvantages. For example, using a semiconductor fin having recess regions with vertical sidewalls rather than curved recess regions can lead to increased variability of off current near the bottom of the fin. In another example, using a thin gate dielectric (e.g., having a thin Equivalent Oxide Thickness (EOT)) can lead to reliability problems and/or leakage current through the thin gate dielectric if the thin gate dielectric is too thin. In yet another example, using a high overlap capacitance combined with a large gate length can lead to contact-gate shorting in regions having a small gate pitch.

Various embodiments of the present inventive concepts, however, provide operations of forming a field effect transistor to increase an overlap capacitance at a lower region of a fin without substantially increasing the desired overlap capacitance at an upper region of the fin. In particular, the overlap capacitance of the lower region of the fin may be controlled to a desired value/level by a doping concentration introduced in a fin extension doping process. As the overlap capacitance at the upper region of the fin does not substantially increase, short-channel effects also may not substantially increase. Accordingly, a field effect transistor may be formed with a higher on-current (e.g., measured in microAmps per micrometer), as well as a reduced/small short-channel effect and low off-current (e.g., measured in nanoAmps per micrometer).

Referring now to FIG. 1A, a perspective view illustrating a fin-shaped Field Effect Transistor (FinFET) is provided, according to various embodiments of the present inventive concepts. A fin body 5 (sometimes referred to herein as a "fin") protrudes from a substrate 1 in a first direction D1. The substrate 1 may be a Silicon Germanium substrate or a Silicon substrate, among other substrates. The fin body 5 extends a greater distance in a second direction D2 than in the first direction D1, which is perpendicular to the second direction D2. A device isolation layer 9 may be on lower sidewalls of the fin body 5, whereas upper sidewalls of the fin body 5 may be exposed.

A gate electrode 17 extending in a third direction D3 crossing the second direction D2 crosses over the fin body 5. The gate electrode 17 is on a top surface, as well as both upper sidewalls, of the fin body 5 thereunder. A gate insulating layer 15 may be disposed between the gate electrode 17 and the fin body 5. Source/drain regions may be disposed in the fin body 5 at both sides of the gate electrode 17. Portions of the fin body 5 overlapped with the gate electrode 17 may correspond to a channel region. Moreover, in various embodiments, the gate electrode 17 may be a dummy gate electrode.

Figure 1B:
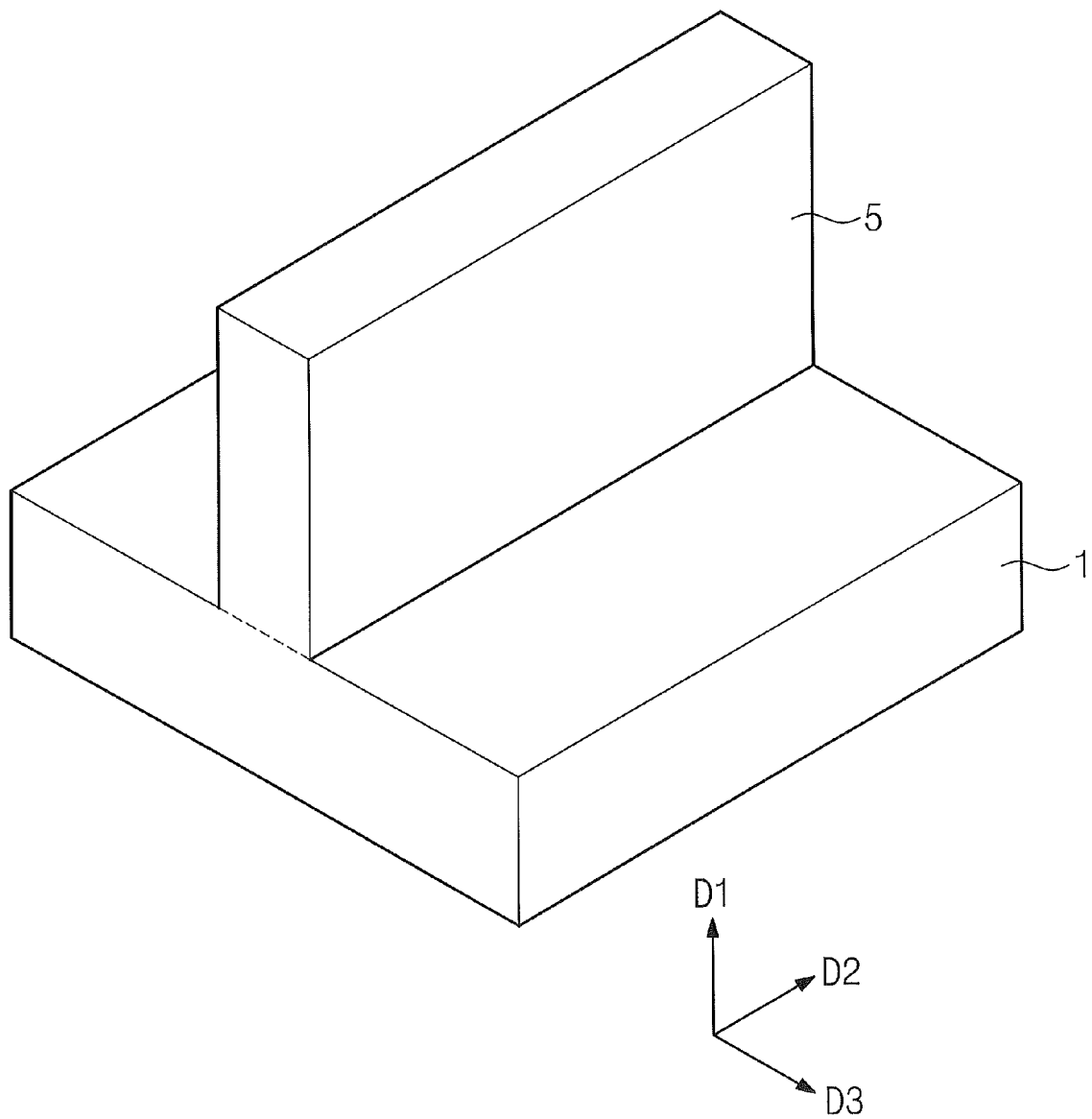
FIG. 1B is a perspective view illustrating a fin of the fin-shaped field effect transistor of FIG. 1A, according to various embodiments of the present inventive concepts.

Referring now to FIG. 1B, a perspective view illustrating a fin body 5 of the fin-shaped field effect transistor of FIG. 1A is provided, according to various embodiments of the present inventive concepts. In particular, FIG. 1B illustrates a perspective view of the fin body 5 before the gate electrode 17 is formed on the fin body 5.

FIGS. 2A-2C, 3A, and 3B are cross-sectional views taken along a line B-B' of FIG. 1A, and illustrate operations of forming a fin-shaped field effect transistor, according to various embodiments of the present inventive concepts. The line B-B' of FIG. 1A is in a D1-D2 plane and is perpendicular to a line A-A' of FIG. 1A in a D1-D3 plane. In particular, the line B-B' of FIG. 1A extends the length of the fin 5 in the second direction D2. Moreover, it will be understood in FIGS. 2A-2C, 3A, and 3B that the fin 5 may protrude from the substrate 1 illustrated in FIGS. 1A and 1B.

Figure 2A:
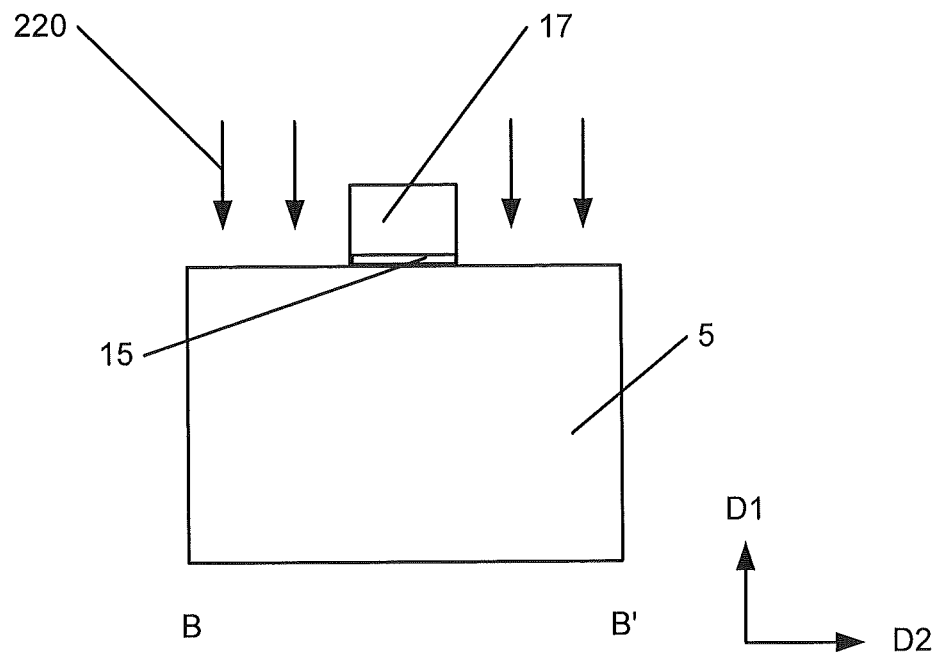
FIGS. 2A-2C, 3A, and 3B are cross-sectional views taken along a line B-B' of FIG. 1A, and illustrate operations of forming a fin-shaped field effect transistor, according to various embodiments of the present inventive concepts.

Referring now to FIG. 2A, operations of forming a FinFET may include implanting dopants 220 into a fin 5 (e.g., a channel fin) after forming a gate 17 on the fin 5. In particular, the dopants 220 may be implanted to provide a dopant concentration providing a desired overlap capacitance for a lower region of the fin 5, as well as providing a relatively low parasitic resistance for the lower region of the fin 5. Accordingly, a net ratio of on-current to off-current may increase for the FinFET, as a result of forming the FinFET by implanting the dopants 220 into the fin 5.

Figure 2B:
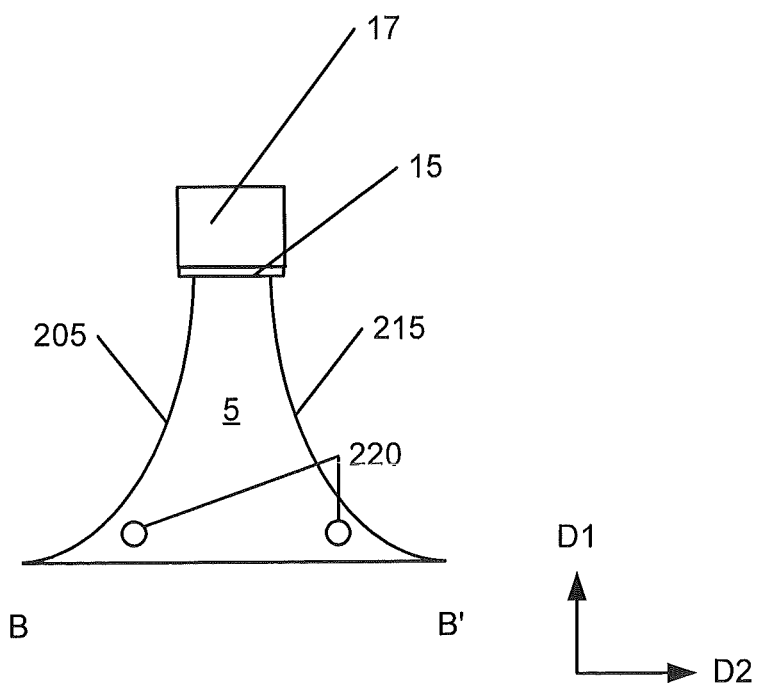

Referring to FIG. 2B, the operations of forming the FinFET may include recessing the fin 5 to form respective curved recess regions on opposing sides of the gate 17. FIG. 2B also illustrates that recessing the fin 5 may include removing some portions of the fin 5 including the dopants 220, as well as keeping other portions of the fin 5 including the dopants 220. For example, substantially all of the dopants 220 that are in an upper region of the fin 5 may be removed, whereas at least some of the dopants 220 that are in a lower region of the fin 5 may remain in the fin 5 after recessing the fin 5. As alternative to recessing the fin 5 that already includes the dopants 220, the dopants 220 may be implanted into the fin 5 after recessing the fin 5.

Figure 2C:
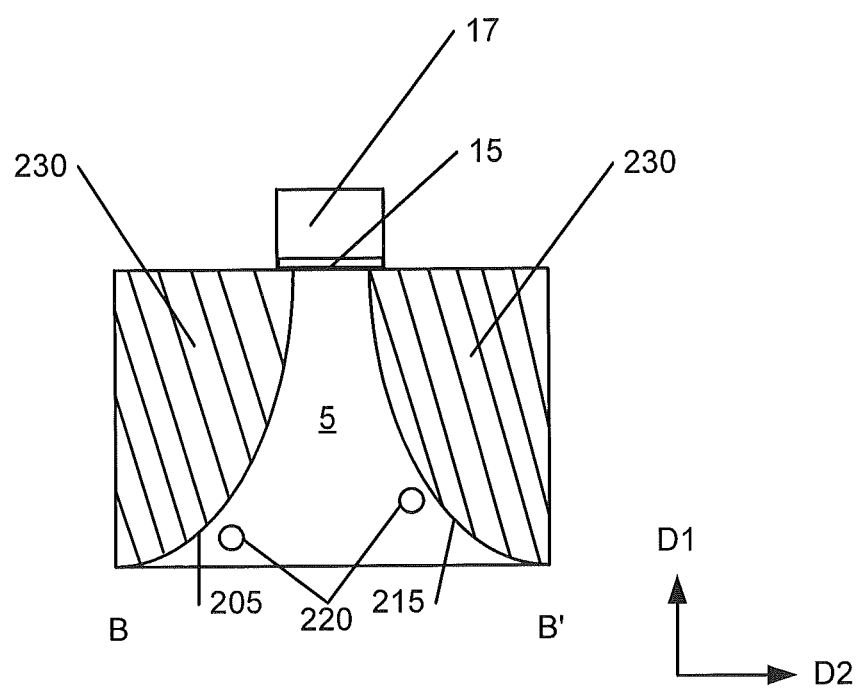

Referring to FIG. 2C, the operations of forming the FinFET may include forming an epitaxial material 230 in the curved recess regions of the fin 5, such that the epitaxial material 230 is adjacent curved fin regions 205 and 215 of the fin 5 (which is doped with the dopants 220). The epitaxial material 230 may provide curved source and drain regions on opposing sides of the gate 17. As the gate 17 may overlap a lower region of the fin 5 that includes the dopants 220, the overlap capacitance of the lower region of the fin 5 may be higher than it otherwise would be without the dopants 220. Moreover, respective overlap capacitances of upper and lower regions of the fin 5 may be controlled substantially independently because the capacitance of the lower region may be substantially controlled by the dopants 220 in the fin 5, whereas the capacitance of the upper region may be substantially controlled by dopants in the source and drain regions (of the epitaxial material 230). Additionally, the dopants in the source and drain regions provided by the epitaxial material 230 may have a higher dopant concentration than the dopants 220 in the fin 5.

Figure 3A:
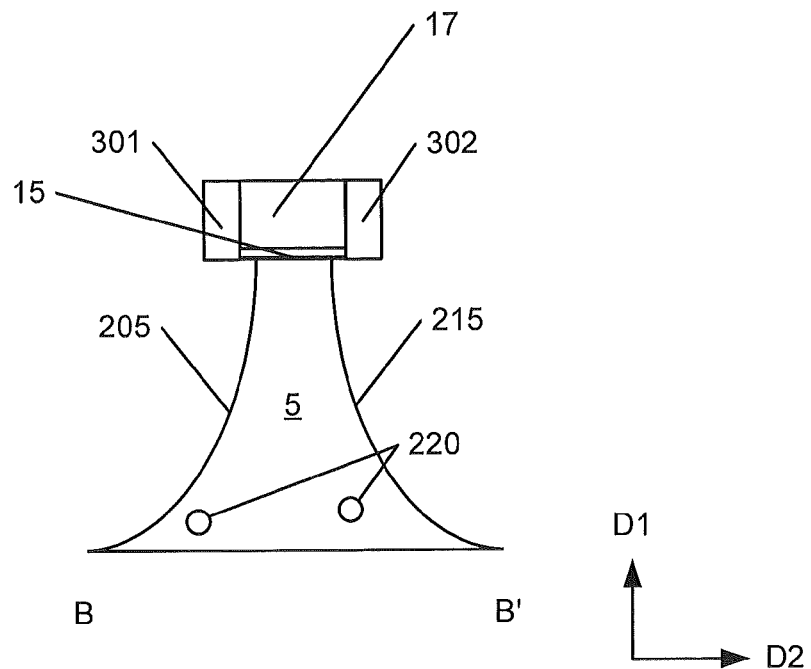
Figure 3B:
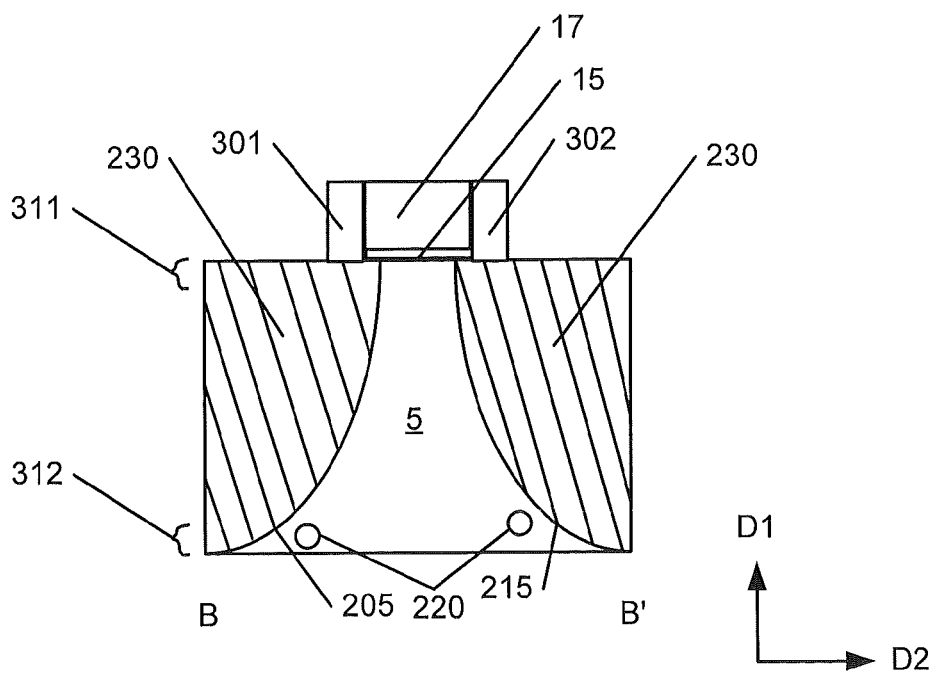

FIGS. 3A and 3B illustrate that the operations of FIGS. 2B and 2C, respectively, may be performed with spacers 301 and 302 on sidewalls of the gate 17. In particular, FIG. 3A illustrates recessing the fin 5 to form respective curved recess regions on opposing sides of the gate 17 while the spacers 301 and 302 are on the opposing sides of the gate 17. Moreover, FIG. 3B illustrates forming the epitaxial material 230 in the curved recess regions of the fin 5 while the spacers 301 and 302 are on the opposing sides of the gate 17.

FIG. 3B further illustrates that the fin 5 may include an upper region 311 and a lower region 312. The upper region 311 may include portions of the fin 5 adjacent the gate 17, whereas the lower region 312 may include portions of the fin 5 adjacent a surface of the substrate 1 (and more distant from the gate 17). Moreover, it will be understood that the upper and lower regions 311 and 312 may exist in the fin 5 regardless of whether the spacers 301 and 302 are present. For example, the fin 5 in FIGS. 2A-2C may have the upper and lower regions 311 and 312.

According to various embodiments of the present inventive concepts, a concentration of the dopants 220 may be greater in the upper region 311 than in the lower region 312. As an example, implanting the dopants 220 into the fin 5, as illustrated in FIG. 2A, may form the upper and lower regions 311 and 312 with respective concentrations of the dopants 220. Moreover, recessing the fin 5 may include recessing the fin 5 including the dopants 220 to remove a larger portion of the upper region 311 of the fin 5 than the lower region 312 of the fin 5 (e.g., as illustrated with respect to the fin 5 in FIGS. 2B and 3A). Accordingly, the percentage of the remaining dopant concentration of the lower region 312 may be larger than the percentage of the remaining dopant concentration of the upper region 311. The relatively low concentration of the dopants 220 in the lower region 312, however, may help to reduce short-channel effects.

FIGS. 4A-4G, 5A-5D, and 6 are flowcharts illustrating operations of forming a FinFET, according to various embodiments of the present inventive concepts. It will be understood that the flowcharts of 4A-4G, 5A-5D, and 6 may include operations that are also illustrated in the cross-sectional views of FIGS. 2A-2C, 3A, and 3B.

Figure 4A:
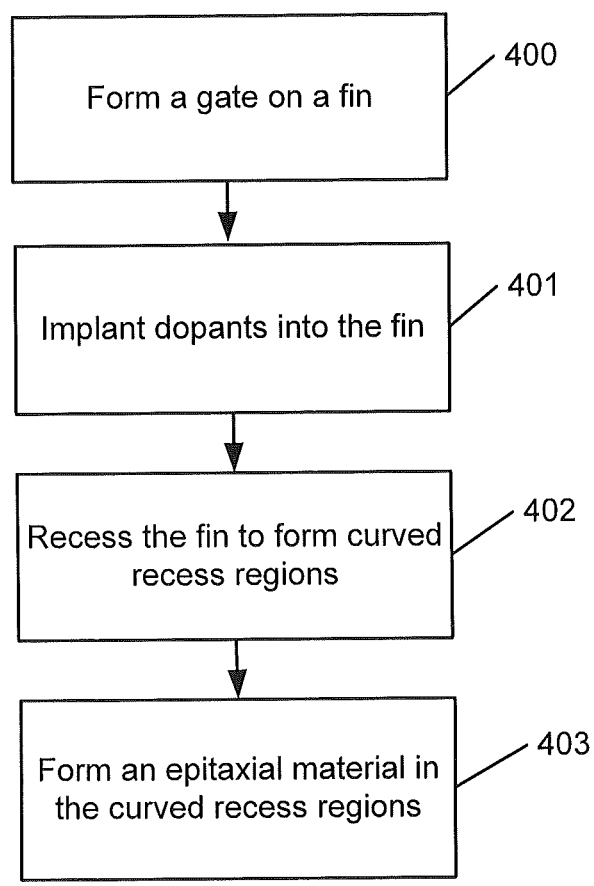
FIGS. 4A-4G, 5A-5D, and 6 are flowcharts illustrating operations of forming a fin-shaped field effect transistor, according to various embodiments of the present inventive concepts.

Referring now to FIG. 4A, the operations may include forming a gate 17 on a fin 5 (e.g., a channel fin) protruding from a substrate 1 (Block 400). After forming the gate 17, the operations may include implanting dopants 220 into the fin 5 (Block 401). Accordingly, an extension region may be implanted into the fin 5. The extension region may be self-aligned to the gate 17. The implant operation(s) of Block 401 may be substantially vertical and/or can be angled (e.g., to implant sides of the fin 5).

Before or after implanting the dopants 220, the operations of forming the FinFET may include recessing the fin 5 to form respective curved recess regions on opposing sides of the gate 17 (Block 402). Moreover, the operations may include forming an epitaxial material 230 in the curved recess regions, such that the epitaxial material 230 is adjacent curved regions 205 and 215 of the fin 5 (Block 403). It will be understood that the operations of Blocks 400-403 may include operations that are also illustrated in the cross-sectional views of FIGS. 2A-2C.

Figure 4B:
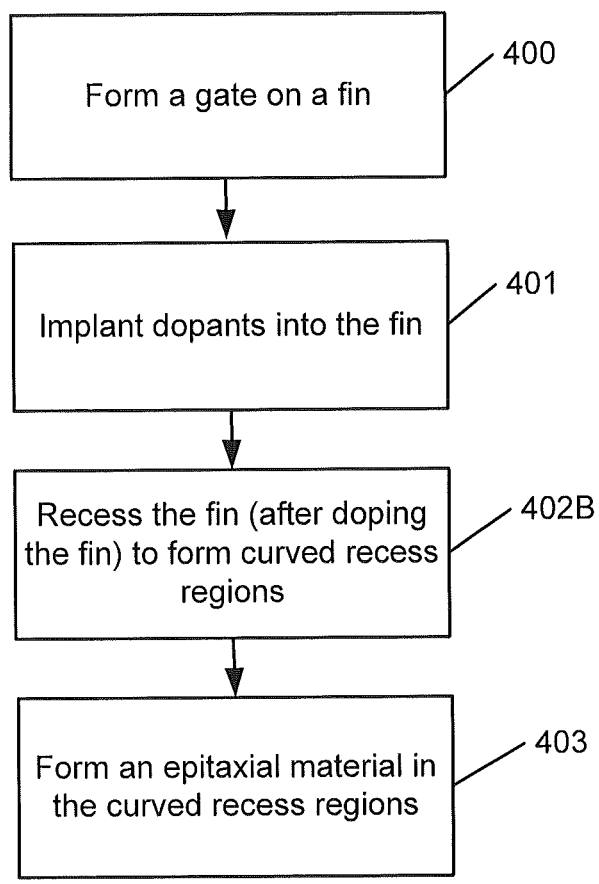

Referring to FIG. 4B, an example is illustrated in which the fin 5 is recessed after implanting the dopants into the fin 5 (Block 402B). Accordingly, recessing the fin 5 may include recessing doped regions (with the dopants 220) of the fin 5 to form the curved fin regions 205 and 215 of the doped fin 5.

Figure 4C:
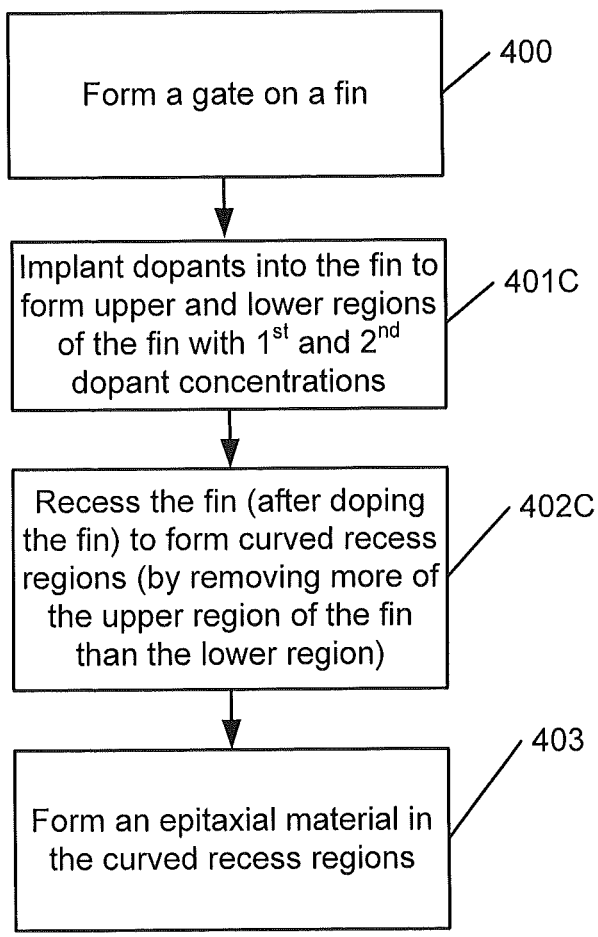

Referring to FIG. 4C, implanting the dopants 220 into the fin 5 may include implanting the dopants 220 into the fin 5 to form upper and lower regions 311 and 312 of the fin 5 (Block 401C). Moreover, as described with respect to FIG. 3B, the lower region 312 may include a smaller dopant concentration than the upper region 311. After implanting the dopants 220, the operations of forming the FinFET may include recessing the fin 5 to remove a larger portion of the upper region 311 of the fin 5 than the lower region 312 of the fin 5 (Block 402C). The percentage of the remaining dopant concentration of the lower region 312 may thus be larger than the percentage of the remaining dopant concentration of the upper region 311. In particular, substantially all of the dopants 220 in the upper region 311 of the fin 5 may be removed.

Figure 4D:
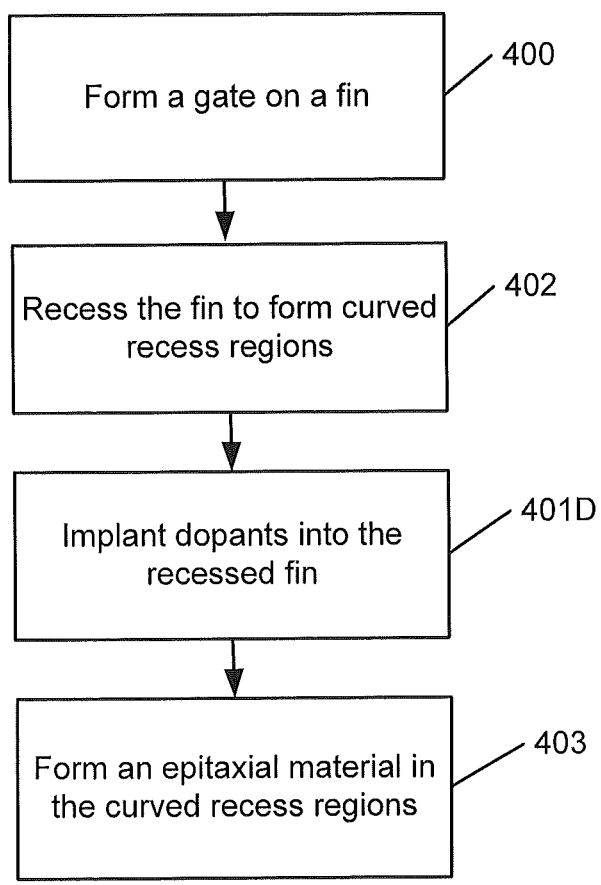

Referring to FIG. 4D, as an alternative to Blocks 402B and 402C of FIGS. 4B and 4C, respectively, the dopants 220 may be implanted into the fin 5 after recessing the fin 5 (Block 401D). In other words, the fin 5 may be recessed in Block 402, and the dopants 220 may subsequently be implanted into the curved fin regions 205 and 215 of the fin 5 in Block 401D. For example, the dopants 220 may be implanted in the lower region 312 of the fin 5 and may not be implanted in the upper region 311 of the fin 5.

Figure 4E:
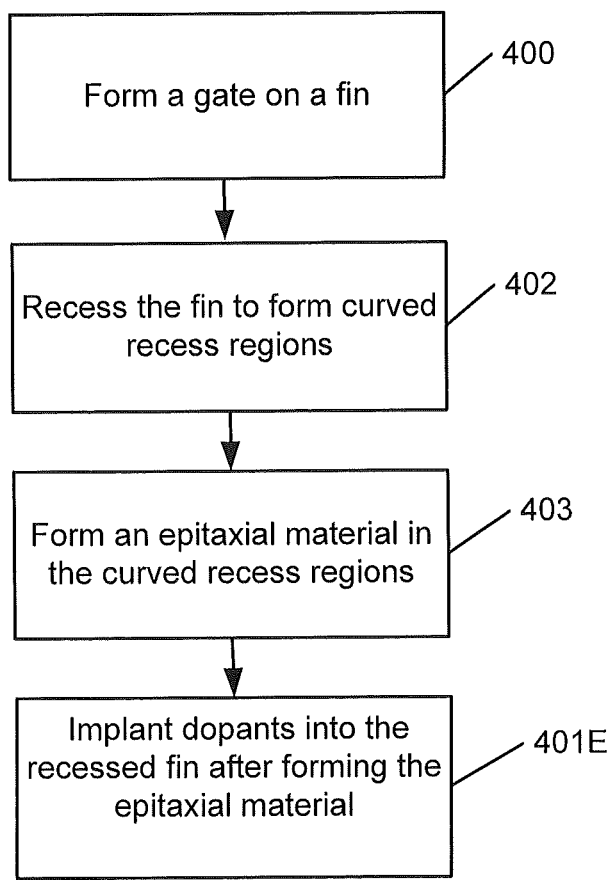

Referring still to FIG. 4D, the epitaxial material 230 may be formed in Block 403 after implanting the dopants 220 in Block 401D, Alternatively, referring now to FIG. 4E, the dopants 220 may be implanted into the curved fin regions 205 and 215 of the fin 5 after forming the epitaxial material 230 (Block 401E).

Figure 4F:
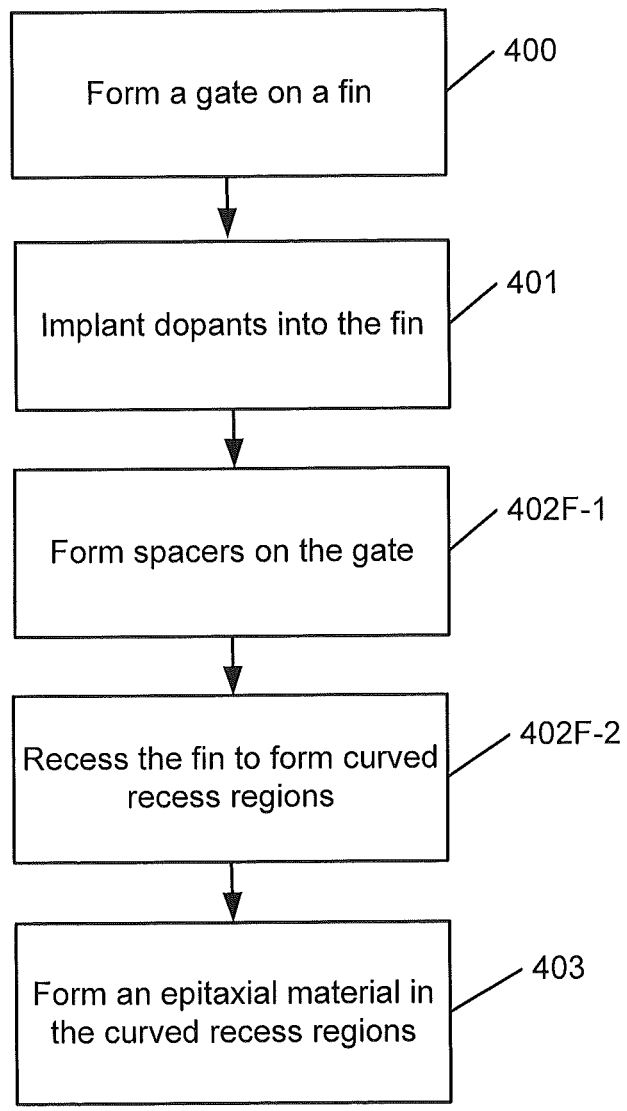

Referring to FIG. 4F, the operations may include forming spacers 301 and 302 on the gate 17 (Block 402F-1). In particular, the spacers 301 and 302 may be formed before recessing the fin 5 in Block 402F-2. Additionally or alternatively, the spacers 301 and 302 may be formed before implanting the dopants 220 into the fin 5.

Figure 4G:
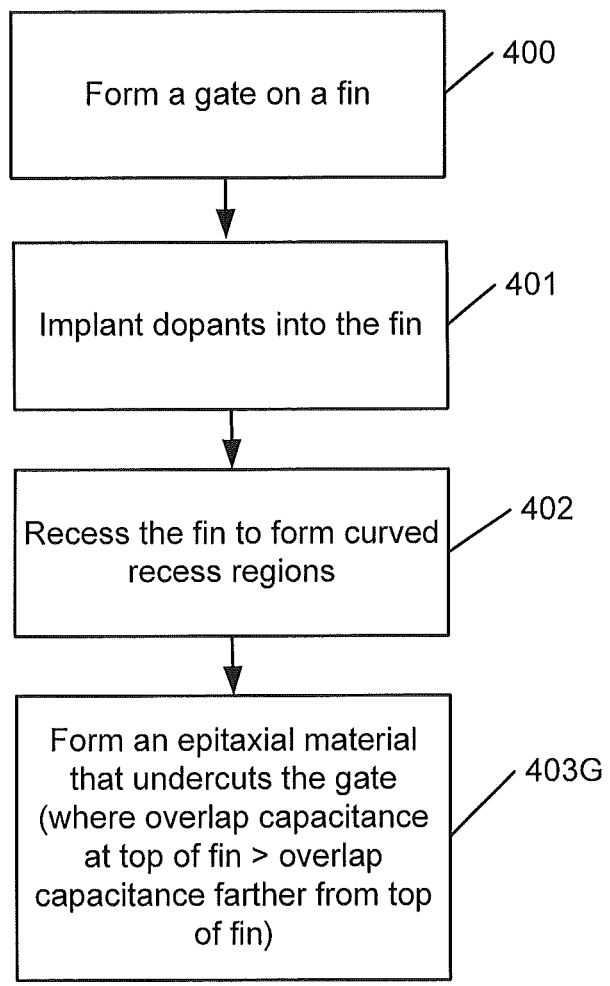

Referring to FIG. 4G, the epitaxial material 230 may be formed in the curved recess regions such that the epitaxial material 230 undercuts a portion of the gate 17 (Block 403G). In particular, the epitaxial material 230 adjacent the upper region 311 (e.g., as illustrated in FIG. 3B) may undercut a portion of the gate 17, whereas the epitaxial material 230 adjacent the lower region 312 does not undercut the gate 17. Rather, edges of the gate 17 overlap the lower region 312 of the fin 5, which includes the dopants 220. Moreover, the overlap capacitance of the upper region 311 of the fin 5 may be larger than the overlap capacitance of the lower region 312 of the fin 5.

Figure 5A:
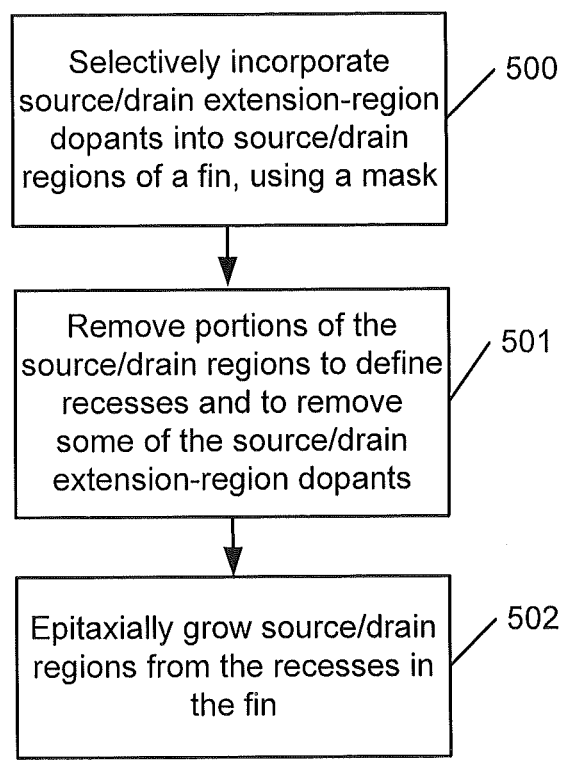

Referring now to FIG. 5A, operations of forming a FinFET may include selectively incorporating source/drain extension-region dopants into source and drain regions of a semiconductor fin 5, using a mask to block incorporation of the source/drain extension-region dopants into at least portions of a channel region of the semiconductor fin 5 (Block 500). The operation(s) of selectively incorporating the source/drain extension-region dopants into the source and drain regions may be performed by implantation, by plasma doping, or by a removable dopant source overlying the semiconductor fin 5. Moreover, it will be understood that the semiconductor fin 5 may protrude from a substrate 1 (e.g., as illustrated in FIGS. 1A and 1B), which may include Silicon Germanium or Silicon, among other materials.

After selectively incorporating the source/drain extension-region dopants in Block 500, the operations may include removing portions of the source and drain regions of the semiconductor fin 5 to define recesses therein and to remove some of the source/drain extension-region dopants in the source and drain regions (Block 501). As an example, referring again to FIG. 2B, the semiconductor fin 5 may include source and drain regions, and the recess operation illustrated in FIG. 2B may remove portions of the source and drain regions, as well as source/drain extension-region dopants (e.g., the dopants 220 or other dopants) therein. The recesses may be adjacent curved regions 205 and 215 of the semiconductor fin 5. Moreover, the operations of forming the FinFET may also include epitaxially growing source and drain regions from the recesses in the semiconductor fin 5 (Block 502). For example, referring again to FIG. 2C, the epitaxial material 230 may provide the source and drain regions epitaxially grown from the recess.

Figure 5B:
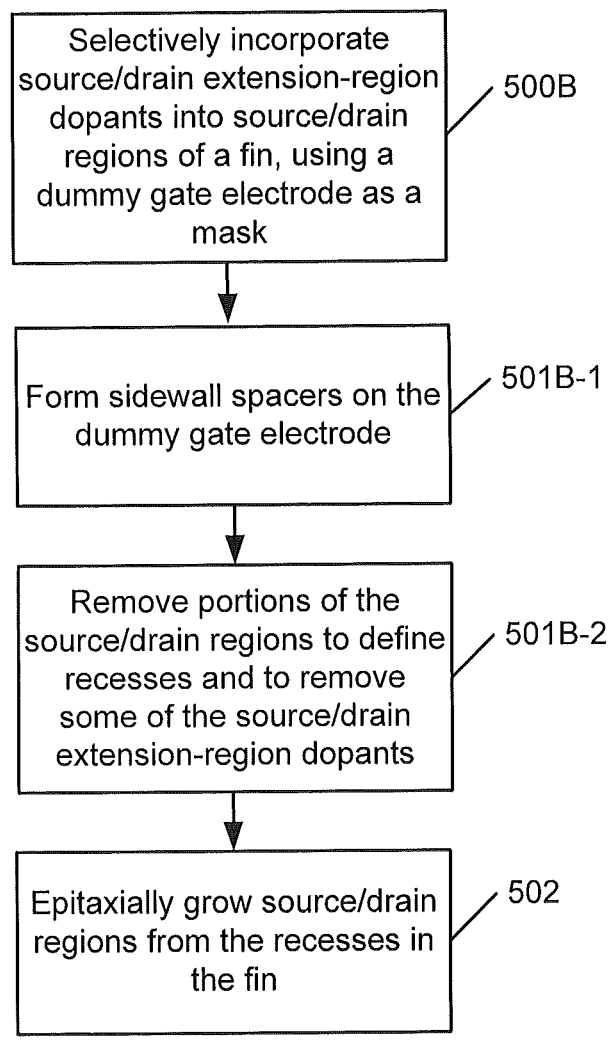

Referring to FIG. 5B, the mask described in Block 500 of FIG. 5A may be a dummy gate electrode. For example, the gate 17 illustrated in FIGS. 1A, 2A-2C, 3A, and 3B may be a dummy gate electrode. Accordingly, the source/drain extension-region dopants may be selectively incorporated into the source and drain regions of the semiconductor fin 5, using a dummy gate electrode as a mask (Block 500B). As is further illustrated in FIG. 5B, the operations of forming the FinFET may include forming sidewall spacers on the dummy gate electrode (Block 501B-1). For example, the epitaxial growth in Block 502 may be preceded by forming the sidewall spacers in Block 501B-1. Defining the recesses in the semiconductor fin 5 in Block 501B-2 may also be preceded by forming the sidewall spacers in Block 501B-1.

Figure 5C:
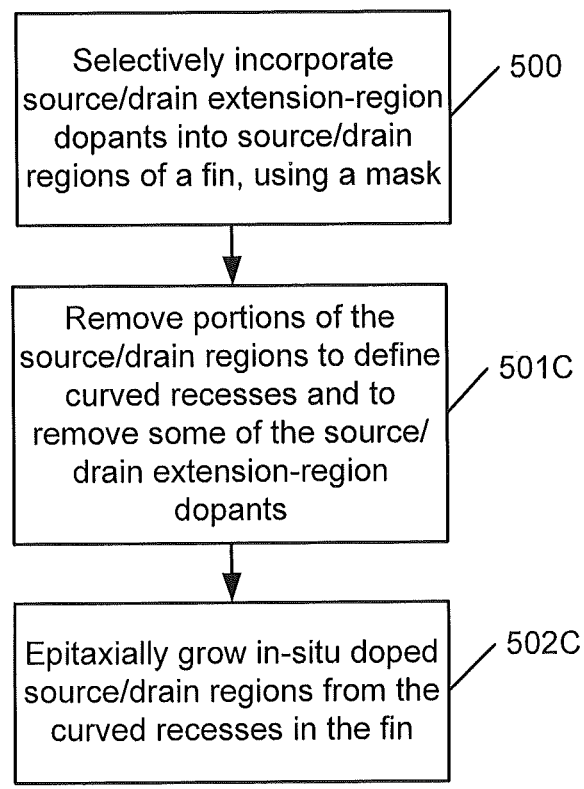

Referring to FIG. 5C, the curved recesses may be formed by removing less than all of source and drain regions of the semiconductor fin 5 that include source/drain extension-region dopants (Block 501C). For example, source/drain extension-region dopants may remain in the lower region 312 of the semiconductor fin 5. After forming the curved recesses in Block 501C, the operation(s) of epitaxially growing source and drain regions may include epitaxially growing in-situ doped source and drain regions from the curved recesses in the semiconductor fin 5 (Block 502C).

Figure 5D:
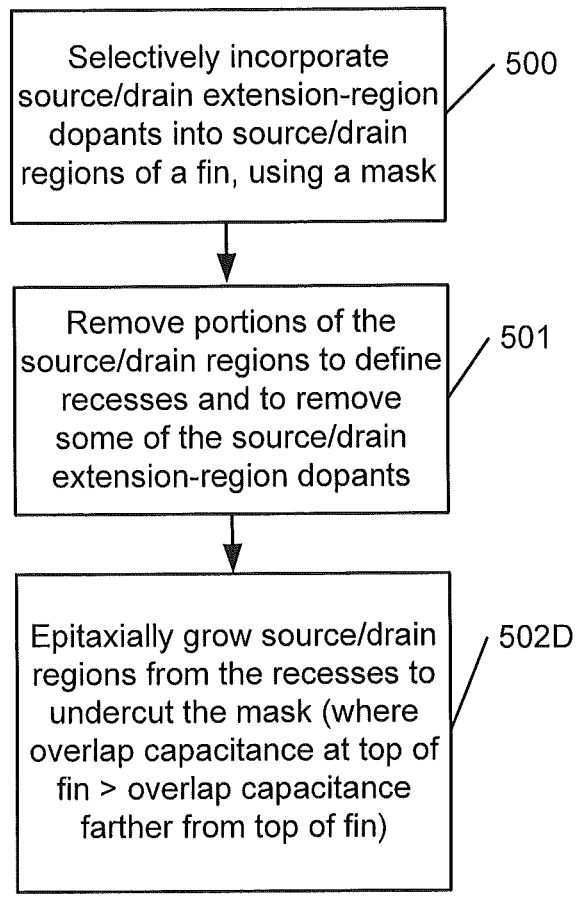

Referring to FIG. 5D, operations of epitaxially growing source and drain regions may include epitaxially growing the source and drain regions from the curved recesses in the semiconductor fin 5 such that the source and drain regions (e.g., indicated by the epitaxial material 230 of FIG. 2C) undercut a portion of the mask (Block 502D). Moreover, the overlap capacitance of an upper region 311 of the semiconductor fin 5 adjacent the mask may be larger than the overlap capacitance of a lower region 312 of the semiconductor fin 5 more distant from the mask.

Figure 6:
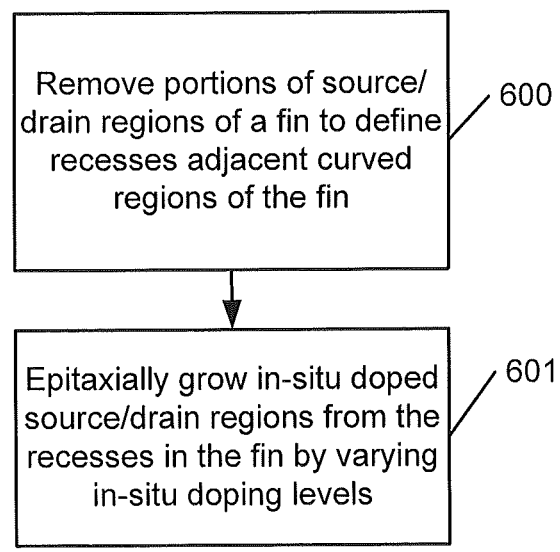

Referring now to FIG. 6, operations of forming a FinFET may include removing portions of source and drain regions of a semiconductor fin 5 to define recesses therein adjacent curved regions 205 and 215 of the semiconductor fin 5 (Block 600). For example, referring again to FIG. 2B, the semiconductor fin 5 may include source and drain regions, and the recess operation illustrated in FIG. 2B may remove portions of the source and drain regions. Referring back to FIG. 6, the operations of forming the FinFET may include epitaxially growing in-situ doped source and drain regions from the recesses in the semiconductor fin 5 by varying in-situ doping levels (Block 601). For example, varying the in-situ doping levels may include increasing and/or decreasing an in-situ doping level to epitaxially grow the in-situ doped source and drain regions from the recesses in the semiconductor fin 5.

Various embodiments illustrated in FIGS. 1A-6 may provide operations of forming a FET. For example, the FET may be formed such that an overlap capacitance of a lower region 312 of a fin 5 is substantially controlled by dopants 220 in the fin 5, whereas a capacitance (e.g., overall capacitance) of an upper region 311 of the fin 5 is substantially controlled by dopants in source and drain regions provided by an epitaxial material 230. Moreover, the capacitance of the upper region 311 of the fin 5 may be greater than the capacitance of the lower region 312 of the fin 5 because of the shape of the fin 5 and because the source and drain regions provided by the epitaxial material 230 may have a higher concentration of dopants than the concentration of the dopants 220 in the fin 5. Additionally, the dopants 220 in the fin 5 may increase the capacitance of the lower region 312 of the fin 5, thus increasing the on-current of the lower region 312 of the fin 5. Furthermore, as the concentration of the dopants 220 in the lower region 312 of the fin 5 is relatively low and the capacitance of the upper region 311 may be held at a desired level (e.g., rather than being increased in an attempt to compensate for the capacitance of the lower region 312), short-channel effects may be reduced. The FET may thus be formed to have an increased ratio of on-current to off-current, without substantial short-channel effects.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed various embodiments and, although specific terms are employed, they are used in a generic and descriptive sense only and not for purposes of limitation.

What is claimed is:

1. A method of forming a fin-shaped Field Effect Transistor (FinFET), comprising:
    forming a gate on a channel fin protruding from a substrate;
    implanting dopants into the channel fin, to form upper and lower regions of the channel fin, after forming the gate;
    recessing the channel fin, to form respective curved recess regions on opposing sides of the gate; and
    forming an epitaxial material in the curved recess regions, such that the epitaxial material is adjacent curved channel fin regions of the channel fin,
    wherein:
        the epitaxial material in the curved recess regions overlaps at least some of the implanted dopants in the lower region of the channel fin;
        forming the epitaxial material comprises epitaxially growing in-situ doped source and drain regions from the curved recess regions;
        a first overlap capacitance associated with the upper region of the channel fin is substantially controlled by first dopants in the in-situ doped source and drain regions;
        implanting dopants into the channel fin comprises implanting second dopants into the channel fin; and
        a second overlap capacitance associated with the lower region of the channel fin is substantially controlled by ones of the second dopants implanted into the lower region of the channel fin.

2. The method of claim 1, wherein:
    implanting dopants into the channel fin after forming the gate comprises implanting dopants into the channel fin to form doped channel fin regions before recessing the channel fin;
    recessing the channel fin comprises recessing the doped channel fin regions to form the curved channel fin regions and to remove substantially all of the dopants from the upper region of the channel fin; and
    at least some of the dopants remain in the lower region of the channel fin after recessing the channel fin.

3. The method of claim 2, wherein:
    the upper and lower regions of the channel fin comprise first and second dopant concentrations, respectively;
    the second dopant concentration comprises a smaller dopant concentration than the first dopant concentration; and
    recessing the doped channel fin regions comprises removing a larger portion of the upper region of the channel fin than the lower region of the channel fin, such that a larger percentage of the second dopant concentration remains than the first dopant concentration.

4. The method of claim 1, wherein:
    implanting dopants into the channel fin after forming the gate comprises implanting dopants into the curved channel fin regions after recessing the channel fin.

5. The method of claim 4, wherein:
    implanting dopants into the curved channel fin regions after recessing the channel fin comprises implanting dopants into the curved channel fin regions before forming the epitaxial material.

6. The method of claim 4, wherein:
    implanting dopants into the curved channel fin regions after recessing the channel fin comprises implanting dopants into the curved channel fin regions after forming the epitaxial material.

7. The method of claim 1, further comprising:
    forming spacers on the gate before recessing the channel fin.

8. The method of claim 1, wherein:
    epitaxially growing the in-situ doped source and drain regions comprises epitaxially growing curved source and drain regions.

9. The method of claim 1, wherein:
the substrate comprises Silicon Germanium; and
forming the gate comprises forming the gate on the channel fin protruding from the substrate comprising Silicon Germanium.

10. The method of claim 1, wherein:
forming the epitaxial material comprises forming the epitaxial material in the curved recess regions such that the epitaxial material undercuts a portion of the gate;
the portion of the gate that is undercut by the epitaxial material overlaps the lower region of the channel fin that includes some of the dopants; and
the first overlap capacitance associated with the upper region of the channel fin comprises a larger capacitance than the second overlap capacitance associated with the lower region of the channel fin.

11. The method of claim 1, wherein:
the first dopants in the in-situ doped source and drain regions comprise a first dopant concentration; and
the ones of the second dopants implanted into the lower region of the channel fin comprise a second dopant concentration that is lower than the first dopant concentration of the first dopants in the in-situ doped source and drain regions.

12. A method of forming a fin-shaped Field Effect Transistor (FinFET), comprising:
selectively incorporating source/drain extension-region dopants into source and drain regions of a semiconductor fin, using a mask to block incorporation of the source/drain extension-region dopants into at least portions of a channel region of the semiconductor fin; then
removing portions of the source and drain regions of the semiconductor fin to define recesses therein and to remove some of the source/drain extension-region dopants in the source and drain regions;
epitaxially growing source and drain regions from the recesses in the semiconductor fin; and
forming a gate on the semiconductor fin,
wherein first dopants in the epitaxially-grown source and drain regions provide a first overlap capacitance associated with an upper region of the semiconductor fin,
wherein the epitaxially-grown source and drain regions overlap second dopants, comprising at least some of the source/drain extension-region dopants in a lower region of the semiconductor fin, and
wherein the second dopants in the lower region of the semiconductor fin provide a second overlap capacitance associated with the lower region of the semiconductor fin.

13. The method of claim 12, wherein:
the mask comprises a dummy gate electrode; and
said epitaxially growing is preceded by forming sidewall spacers on the dummy gate electrode.

14. The method of claim 12, wherein:
said epitaxially growing comprises epitaxially growing in-situ doped source and drain regions from the recesses in the semiconductor fin.

15. The method of claim 14, wherein:
said removing comprises removing less than all of the portions of the source and drain regions of the semiconductor fin comprising source/drain extension-region dopants therein
the recesses comprise curved recesses; and
said epitaxially growing comprises epitaxially growing the in-situ doped source and drain regions from the curved recesses in the semiconductor fin.

16. The method of claim 12, wherein:
said selectively incorporating comprises selectively incorporating the source/drain extension-region dopants into the source and drain regions by implantation, by plasma doping, or by a removable dopant source overlying the semiconductor fin.

17. The method of claim 12, wherein:
the semiconductor fin comprises a semiconductor fin protruding from a substrate comprising Silicon Germanium.

18. The method of claim 12, wherein:
said epitaxially growing comprises epitaxially growing the source and drain regions from the recesses in the semiconductor fin to undercut a portion of the mask;
the portion of the mask that is undercut by the epitaxially-grown source and drain regions overlaps the lower region of the semiconductor fin that includes some of the source/drain extension-region dopants; and
the first capacitance associated with the upper region of the semiconductor fin comprises a larger capacitance than the second capacitance associated with the lower region of the semiconductor fin.

19. The method of claim 12, wherein said removing comprises removing substantially all of the source/drain extension-region dopants from the upper region of the semiconductor fin, and wherein at least some of the source/drain extension-region dopants remain in the lower region of the semiconductor fin after said removing.

20. A method of forming a fin-shaped Field Effect Transistor (FinFET), comprising:
forming a gate on a channel fin protruding from a substrate;
implanting dopants into the channel fin, to form upper and lower regions of the channel fin, after forming the gate;
recessing the channel fin, to form respective curved recess regions on opposing sides of the gate; and
forming an epitaxial material in the curved recess regions, such that the epitaxial material is adjacent curved channel fin regions of the doped channel fin and such that the epitaxial material undercuts a portion of the gate, wherein the portion of the gate that is undercut by the epitaxial material overlaps the lower region of the doped channel fin that includes some of the dopants.

21. A method of forming a fin-shaped Field Effect Transistor (FinFET), comprising:
selectively incorporating source/drain extension-region dopants into source and drain regions of a semiconductor fin, using a mask to block incorporation of the source/drain extension-region dopants into at least portions of a channel region of the semiconductor fin; then
removing portions of the source and drain regions of the semiconductor fin to define recesses therein and to remove some of the source/drain extension-region dopants in the source and drain regions; and
epitaxially growing source and drain regions from the recesses in the semiconductor fin to undercut a portion of the mask, wherein the portion of the mask that is undercut by the epitaxially-grown source and drain regions overlaps a lower region of the semiconductor fin that includes some of the source/drain extension-region dopants.

* * * * *